United States Patent [19]

Schroeder et al.

[11] Patent Number: 5,508,611
[45] Date of Patent: Apr. 16, 1996

[54] ULTRATHIN MAGNETORESISTIVE SENSOR PACKAGE

[75] Inventors: Thaddeus Schroeder; Chi H. Leung, both of Rochester Hills; Bruno P. B. Lequesne, Troy, all of Mich.

[73] Assignee: General Motors Corporation, Detroit, Mich.

[21] Appl. No.: 232,976

[22] Filed: Apr. 25, 1994

[51] Int. Cl.⁶ .......................... G01R 33/06; H01L 43/02; H01L 27/22; H05K 3/30
[52] U.S. Cl. .................. 324/252; 29/834; 174/52.1; 324/207.21; 361/749
[58] Field of Search .................................. 324/173, 174, 324/207.2, 207.21, 207.25, 235, 251, 252; 338/32 R, 32 H; 174/52.1, 52.2, 52.3; 361/749–751, 756, 761, 764, 783; 29/595, 834, 835

[56] References Cited

U.S. PATENT DOCUMENTS

| | | | |
|---|---|---|---|
| 4,110,676 | 8/1978 | Edick et al. | 324/174 X |
| 4,926,122 | 5/1990 | Schroeder et al. | 324/207.13 |
| 4,928,089 | 5/1990 | Gasiunas et al. | 324/207.2 X |
| 5,021,736 | 6/1991 | Gonsalves et al. | 324/252 X |
| 5,093,617 | 3/1992 | Murata | 324/207.2 X |
| 5,111,412 | 5/1992 | Tornblom | 324/225 X |
| 5,210,493 | 5/1993 | Schroeder et al. | 324/252 |
| 5,216,405 | 6/1993 | Schroeder et al. | 338/32 R |
| 5,233,295 | 8/1993 | Murata et al. | 324/207.2 |
| 5,250,925 | 8/1993 | Shinkle | 338/32 R |
| 5,293,125 | 3/1994 | Griffen et al. | 324/174 X |
| 5,332,965 | 7/1994 | Wolf et al. | 324/207.2 X |
| 5,414,355 | 5/1995 | Davidson et al. | 324/207.2 |

FOREIGN PATENT DOCUMENTS

| | | | |
|---|---|---|---|
| 361456 | 4/1990 | European Pat. Off. | 324/207.21 |
| 2624966 | 6/1989 | France . | |
| 195284 | 8/1990 | Japan | 324/207.21 |
| 212789 | 8/1990 | Japan | 324/207.21 |
| 216482 | 8/1992 | Japan | 324/207.21 |
| 1180588 | 2/1970 | United Kingdom | 324/173 |

OTHER PUBLICATIONS

Tomita et al; Electric Circuit For Magnetic Sensor *Patent Abstracts of Japan,* vol. 14, No. 490 (P–1122), 25 Oct. 1990.
Watanabe et al; Magnetic Detection Sensor, *Patent Abstracts of Japan,* vol. 7, No. 136 (E–181), 14 Jun. 1983.
Noro et al; Two–Layer Tape Lead Wire For Magnetic Head, *Patent Abstracts of Japan,* vol. 17, No. 593 (E–1454) 28 Oct. 1993.
Ishizuka; Inner Rotor Type DC Brushless Motor, *Patent Abstracts of Japan,* vol. 12, No. 469 (E–691), 8 Dec. 1988.
Campbell, Peter; Miniature Magnetic Encoder, Machine Design, vol. 62, No. 5, 8 Mar. 1990, pp. 105–108.
Meier, J. H. Analog No–Contact Transducer, IBM Technical Disclosure Bulletin, vol. 17, No. 11 Apr. 1975 pp. 3250, 3251.

*Primary Examiner*—Gerard R. Strecker
*Attorney, Agent, or Firm*—George A. Grove

[57] ABSTRACT

A magnetic field sensor assembly comprising a flexible circuit board having a major surface with a predetermined area for receiving at least one semiconductor magnetic field sensor chip, the chip is affixed to the predetermined area of the flexible circuit board in relationship to a predetermined reference location, which reference location can be used in encapsulation and/or use of the magnetic field sensor chip. Several magnetic field sensor chips can be readily, closely disposed on the flexible circuit board in predetermined known locations. The circuit board can conform to any desired predetermined shape. The shape can be determined by a circuit's conformation on a supporting magnet body.

4 Claims, 3 Drawing Sheets

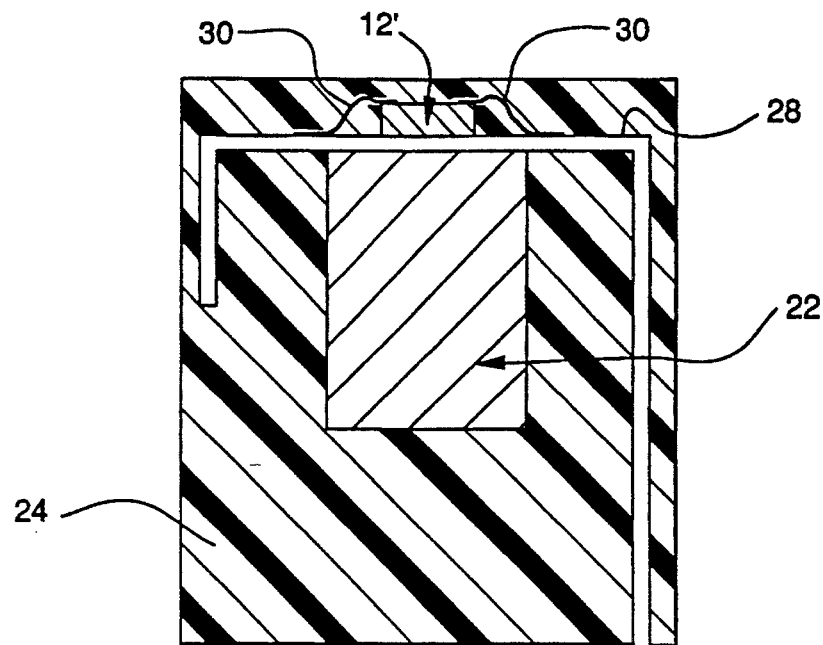
FIG-3
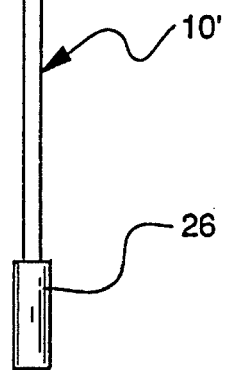
FIG-4
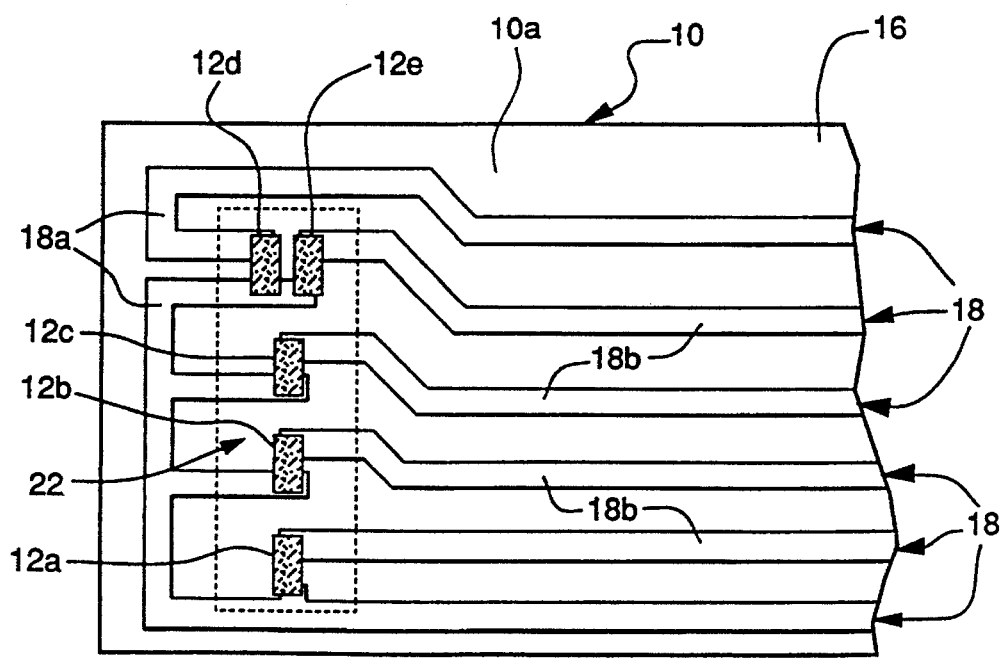

ULTRATHIN MAGNETORESISTIVE SENSOR PACKAGE

FIELD OF THE INVENTION

The present invention generally relates to magnetic field sensitive devices, such as magnetoresistors and Hall effect sensing devices, and the packaging therefor. More particularly, this invention relates to the improved sensors of this type, wherein the improvement is attributable to the sensor packaging. Packaging in accordance with this invention permits minimal distance between the sensing device and an object being sensed.

BACKGROUND OF THE INVENTION

Magnetic field sensing devices which detect rotation and/or position have been widely used. Rotation and/or position is detected by detecting changes in the strength of the magnetic field. Magnetic field strength is defined as the magnetomotive force developed by a permanent magnet per unit distance in the magnetization direction.

For example, an increase in the strength of magnetic field, corresponding to the drop in the reluctance of a magnetic circuit, will occur as an object made from a high magnetic permeability material such as iron is moved toward the magnet. Magnetic permeability is the ease with which the magnetic lines of force, designated as magnetic flux, can pass through a substance magnetized with a given magnetizing force. Quantitatively, magnetic permeability is expressed as the ratio between the magnetic flux density (the number of lines of magnetic flux per unit area which are perpendicular to the direction of the flux) produced and the magnetic field strength, or magnetizing force.

The output signal of a magnetic field sensing device is dependent upon the strength of the magnetic field. It is therefore effective in detecting the distance between the sensing device and an object within the magnetic circuit. The range within which the object can be detected is limited by the flux density, as measured in gauss or teslas. It should be mentioned that steel conducts magnetic flux much more greatly than air. It thus has a lower "reluctance" to the passage of magnetic flux than air.

It may be desired to determine the speed or rotation position of a low reluctance rotating object, such as a steel disk mounted on a shaft. In such instance, the steel disk is typically provided with distinctive circumferential surface features, such as one or more teeth that project outward from the circumference of the disk toward the sensing device. As the disk rotates on its axis, the proximity of a tooth to the sensing device will increase the strength of the magnetic field in the spatial region of the sensing device. Accordingly, by monitoring the output of the sensing device, the rotation or speed of the disk can be determined by correlating the peaks in the sensor's output with known number of teeth on the circumference of the disk. Likewise, when the teeth are irregularly spaced in a predetermined pattern, the rotation or position of the body can be determined by correlating the peak intervals with the known intervals between the teeth on the disk.

Two prominent forms of such sensing devices are the magnetoresistor and the Hall effect sensor. A magnetoresistor is a device whose resistance varies with the strength of the magnetic field applied to the device. Generally, the magnetoresistor is a slab of semiconductive material. For many automotive applications, the preferred form of a magnetoresistor is a thin elongated body of a carrier mobility semiconductor material having a high current carrier mobility, such as indium antimonide (InSb) or indium arsenide (InAs). The thin elongated body has electrical contacts at its ends. It is recognized that the body does not have to be rectangular. It can have a multiplicity of shapes, including sinuous and/or U-shaped. If U-shaped, the contacts will, of course, be adjacent one another. In any event, the magnetoresistor is mounted within and perpendicular to the flux in a magnetic circuit which includes a permanent magnet and an exciter. The exciter is a high magnetic permeability element having special edge or surface conformations projecting toward the sensor. These projecting surface features increase the strength of the magnet's magnetic field between the surface of the exciter and the permanent magnet. As indicated above, the exciter can be in the form of a wheel or disk having a series of circumferentially spaced teeth, such as a gear. Alternatively, it can be a disk having one or more radial slots in its circumference that define gaps in its periphery. When the exciter disk rotates, its outer periphery moves linearly toward and away from the stationary magnetoresistor element. In doing so, it changes the reluctance of the magnetic circuit involving the magnetic field sensor. This causes the magnetic flux through the magnetoresistor element to vary in a manner corresponding to the position of the teeth and/or the slots on the exciter disk. With the change in magnetic flux, there occurs a corresponding change in magnetic field strength to which the magnetic field sensor is exposed. If the magnetic field sensor is a magnetoresistor, higher magnetic field strength increases resistance, and lower strength reduces resistance. One can view a magnetoresistor as a voltage device if the current flow is small.

A Hall effect sensor is also a semiconductor device and is packaged analogous to the packaging of a magnetoresistor. However, a Hall effect device relies upon a transverse current flow that occurs in the presence of a magnetic field. Accordingly, a Hall effect sensor is primarily a current device. As mentioned, a magnetoresistor is a voltage device. The Hall effect sensor is primarily driven by a direct current source having electrodes contacting opposite ends of the Hall effect sensor. This creates a longitudinal current flow to the sensor's body. In the presence of a magnetic field, a transverse current is induced in the sensor, which can be detected by a second pair of electrodes transverse to the first pair, i.e., on opposite sides of the body. The second pair of electrodes can be connected to a volt meter to determine the electrical potential transversely created across the surface of the sensor by the magnetic field. Variations in the magnetic field will create variations in the transverse potential across the surface of the sensor. Accordingly, the transverse potential in a Hall effect sensor is analogous to the voltage output of a magnetoresistor and can be analogously used for magnetic field detection.

With increasing sophistication of products, magnetic field sensing devices have also become common in products that rely on electronics and their operation, such as automobile control systems. Common examples of automotive applications where magnetic field sensing can be used include detection of engine crank shaft and/or cam shaft rotation and position for ignition timing. It also includes detection of wheel speed for antilock braking systems and for four-wheel steering systems. Other sensing applications are also of interest. For detecting wheel speed, the exciter is typically a high permeability metal wheel mounted inboard from the vehicle's road wheel. The exciter wheel can be coaxially mounted with the road wheel so as to rotate at the same speed as the road wheel. The exciter wheel typically will have a number of teeth which extend radially from the perimeter of the exciter wheel toward a magnetic field sensor. The teeth can be on an inner or outer circumference of the exciter wheel. As noted before, the exciter wheel is formed of a high magnetic permeability material, such as iron or steel. As a tooth on the exciter wheel rotates toward the magnetic field sensor, the strength of the magnetic field increases in the spatial area of the sensor as a result of a decrease in the magnetic circuit's reluctance in that spatial area. Subsequently, the magnetic circuit reluctance increases and the strength of magnetic field decreases as the tooth moves away from the magnetic field sensor. The result is an increase in voltage across a magnetoresistor and a transverse current increase in a Hall effect device.

A well-known shortcoming of magnetic field sensing devices is their critical dependence upon distance between the exciter and the sensing device itself. This distance is generally referred to as air gap. It commonly refers to the distance between the exciter and the magnetic field sensing semiconductor chip surface, even if part of that distance includes a protective plastic encapsulation around the semiconductive magnetic field sensing chip. Magnetic field strength decreases in air as a function of the squared distance from the source. Accordingly, as air gap increases, the tooth/slot output voltage difference of the magnetic field sensor decreases. As this difference decreases, the more difficult it is to accurately recognize that the output of the device has varied.

The output of a magnetoresistor is particularly susceptible to the detrimental effects of a large air gap in relatively low strength magnetic fields, such as magnetic fields found in typical automotive applications (approximately 500 to 2000 gauss). As indicated above, this is detrimental because resistance of the magnetoresistor is dependent upon the square of the magnetic field's strength. Specifically, the resistance of the magnetoresistor under the influence of a magnetic field is a direct function of mobility squared times this magnetic field strength squared.

Conventionally, the air gap is defined as the distance between the exciter and the outer surface of the package containing the sensing device. An "effective air gap" may be described as the distance between the exciter and the active surface of the active component in the sensing device. A semiconductor chip forms the active element in a magnetoresistor or Hall effect device. In commercially available devices, a relatively thick plastic coating environmentally and mechanically protects the chips and also provides or reinforces terminal connections to the semiconductor chips. The plastic encapsulation frequently also encloses a permanent magnet associated with the semiconductor magnetic field sensing chip. For particularly harsh environments, such as automotive environments, the encapsulated chip often has to be repackaged. It is repackaged in still an additional housing that also covers the active area of the chip. This provides additional environmental protection. However, it also interposes still another layer of plastic between the exciter and the semiconductor chip itself. This further increases the "effective air gap". Thus, while improving the life of the sensing device, a particularly significant shortcoming to this "repackaging" approach is that it decreases the change in magnetic field strength as a tooth passes close to the sensing device. This is due to the larger "effective air gap".

U.S. Pat. No. 5,250,925, issued Oct. 5, 1993 to George A. Shinkle, discloses an improved packaging technique by which the originally encapsulated chip can be retained in the holder without adding another layer of plastic between the exciter, i.e., the toothed wheel, and the originally encapsulated chip. It does so by providing a hollow housing that can receive the originally encapsulated semiconductor chip and magnet, and has means for sealing the leads extending from that encapsulation within the housing. In a preferred embodiment, the prepackaged unit is cylindrical and has a circumferential groove, within which an o-ring seats. The housing has a cylindrical recess within which the prepackage unit nests, with the o-ring providing an interfacial seal.

Maintaining minimum "effective air gap" is an important factor in using a magnetic field sensor. Accurately positioning the magnetically sensitive semiconductor chip with respect to the exciter wheel is also important, especially if the exciter wheel is quite thin. If not positioned directly in line, "effective air gap" increases, and sensitivity thereby decreases. Positioning is particularly important if multiple sensors are used in a single package. This invention makes such positioning much easier. In addition, lower cost manufacturing techniques are desired. This invention helps in this latter connection as well. Still further, as electronic products are miniaturized, the sensor packages have to be miniaturized. This invention helps here too. In addition, new concepts in packaging are desired for new types of magnetic field sensing applications. This invention permits use of magnetic field sensing in new ways.

OBJECTS AND SUMMARY OF THE INVENTION

It is, therefore, an object of this invention to provide a low "effective air gap" package for a magnetic field sensor.

It is another object of this invention to provide a precisely located magnetically sensitive semiconductor chip within a magnetic field sensor package, which package is flexible in use.

Another object of this invention is to provide an improved method of manufacturing a magnetic field sensor package, which method inherently provides a precisely located magnetic field sensor chip.

Still another object of this invention is to provide a plurality of magnetic field sensor chips on the same support, very precisely located with respect to each other and/or with respect to a reference location on the support, and to provide a method of making such a product.

In a preferred embodiment, this invention patterns a flexible circuit board to have a plurality of precisely predetermined locations where the magnetic field sensor chips are to be located. The magnetic field sensor chips are affixed to the board in the predetermined locations and each connected with the circuit pattern on the circuit board. This locates the chips with respect to one another and to one or more reference points or locations on the circuit pattern and/or the supporting flexible circuit board. The circuit pattern concurrently provides electrical leads to the magnetic field sensor chips and means for connection to a source of voltage. For some applications, it may be desirable to have only one magnetic field sensor chip affixed to the flexible circuit board.

The flexible circuit board can be embedded in a plastic encapsulation as prepackaged magnetic field sensing units now are. The prepackaged units can include a magnet or a high magnetic permeability body affixed to the circuit board. Also, the prepackaged units can be supported, if desired, in the holder described in the aforementioned U.S. Pat. No. 5,250,925 Shinkle.

Alternatively, the flexible circuit board can be used with or without an overlying protective polyimide film. It can even be incorporated as pan of a control circuit board within a housing in an electrical apparatus.

Assembly of the chips on the circuit board can be done in accordance with known accepted semiconductor chip placement techniques. This increases product durability and lowers manufacturing costs. Other objects, features and advantages of this invention will become more apparent from the following description.

BRIEF DESCRIPTION OF THE DRAWINGS

FIG. 3 shows a cross-sectional view of a prepackaged unit having a wire-bonded magnetoresistor chip, instead of a "flip chip".

FIG. 4 shows an enlarged, fragmentary plan view of the left end of the multiple magnetoresistor flexible circuit board assembly shown in FIG. 5.

DETAILED DESCRIPTION OF THE DRAWINGS

Figure 1:
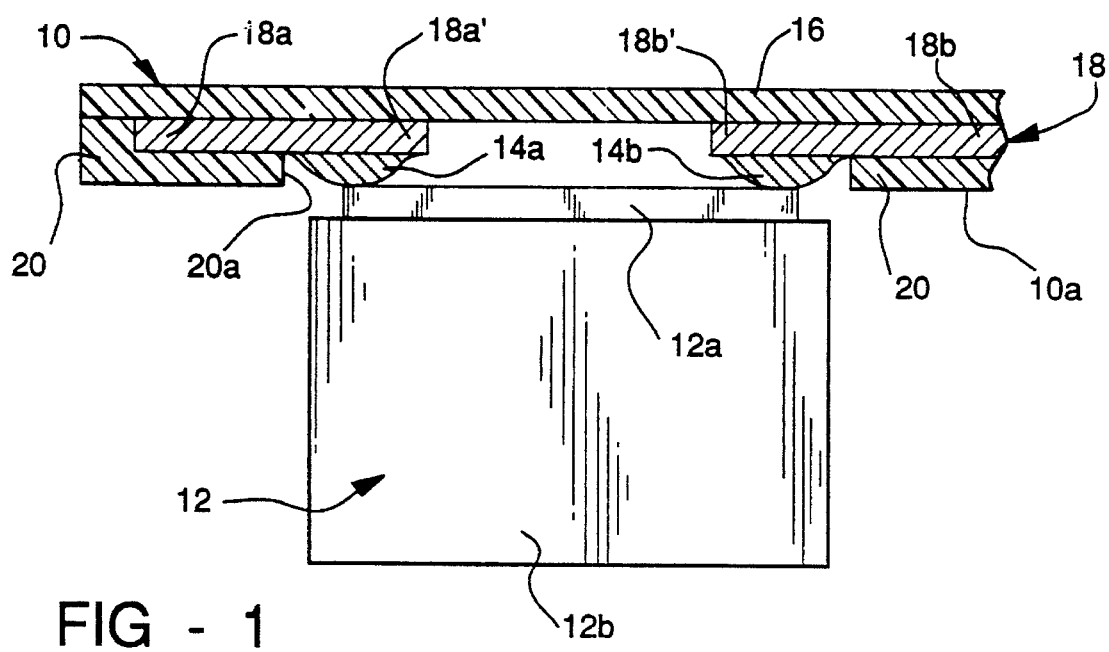
FIG. 1 shows an enlarged, fragmentary sectional view of a flexible circuit board having a magnetoresistor "flip chip" affixed thereto in a predetermined location.

Reference is now made to FIG. 1, which shows a flexible circuit board 10 to which a magnetoresistor 12 is affixed by means of contact bumps 14, more specifically 14a and 14b. We refer to this type of chip as a "face bonded chip or flip chip". Flexible circuit board 10 comprises a base layer 16 of polyimide plastic about 0.002 inch thick. A copper film in the form of an electrical circuit pattern 18 that includes portions 18a and 18b is affixed to the plastic base layer 16. Film copper circuit pattern 18 is about 0.001 inch thick. The copper circuit pattern 18 is covered by a polyimide layer 20 that has a window 20a therein which exposes facing ends of circuit portions 18a and 18b. Solder bumps 14 on the exposed ends of circuit pattern portions 18a and 18b bond to magnetoresistor contact metallizations on the facing surface of magnetoresistor 12. Magnetoresistor 12 can be a sinuous mesa 12a of indium antimonide that is disposed on a gallium arsenide chip-like substrate 12b. The resultant composite magnetoresistor chip 12 could also be a Hall effect sensor chip. The particular nature of the magnetic field sensor chip 12 does not form any part of this invention. It is recognized that such chips have many configurations and even different compositions and layers. It is contemplated that virtually all of the many configurations for such chips and for electrical contacts to such chips can be used in this invention. Typically, the indium antimonide mesa layer 12a would be about 1 to 5 microns thick. The gallium arsenide layer is considerably thicker, perhaps in the range of about 0.005 to 0.010 inch. Flexible circuit board 10 is generally of a polyimide thickness of about 0.001 to 0.005 inch. It can be of any of the known and accepted commercially available flexible circuit board materials as, for example, Pyralux, which is obtainable from DuPont Electronics, which has a place of business in Wilmington, Del.

Figure 2:
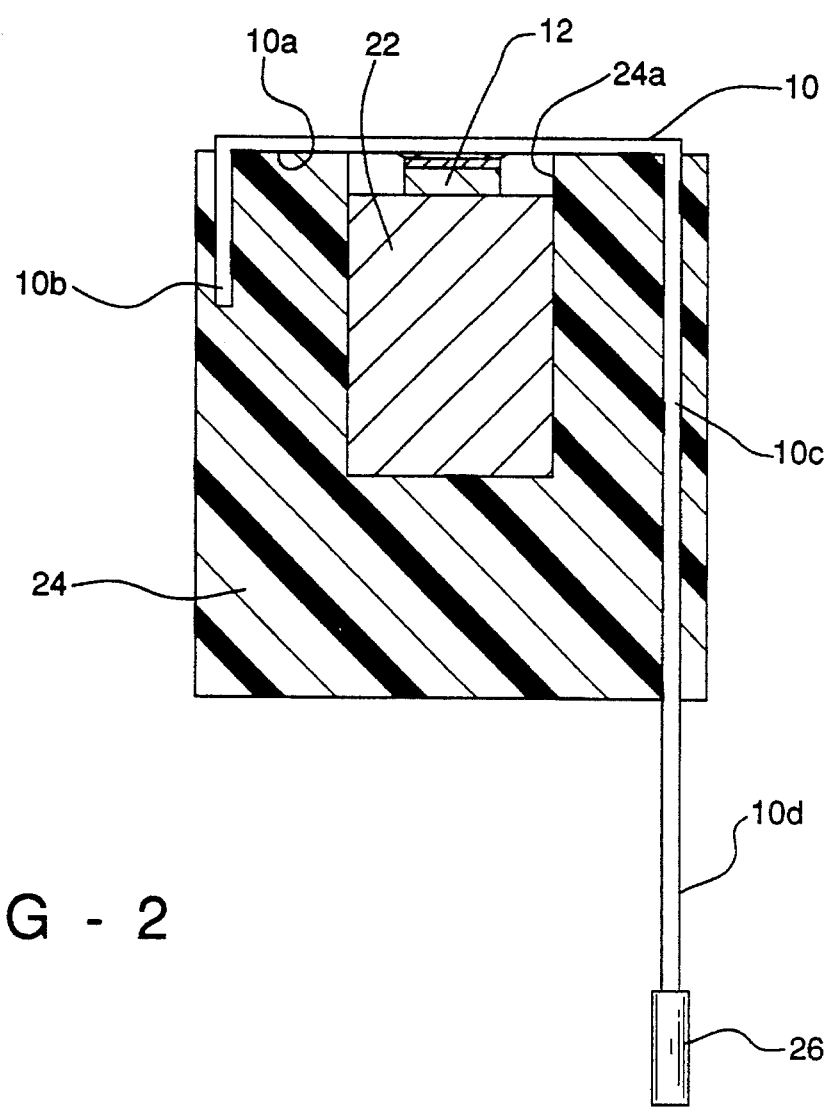
FIG. 2 shows a sectional view of a prepackaged unit that includes a magnet and plastic encapsulation added to the FIG. 1 combination.

FIG. 2 shows the flexible circuit board 10 of FIG. 1 and a magnetoresistor chip 12 assembled together with a magnet body 22. Magnetoresistor 12 and magnet body 22 are located within a recess 24a within plastic encapsulation 24. Plastic encapsulation 24 adheres to the circuit pattern face of flexible circuit board 10. Plastic encapsulation 24 also encloses circuit board end portion 10b and intermediate portion 10c, which are on opposite sides of magnetoresistor 12. End 10d of the circuit board extends out of the plastic encapsulation 24 for attachment to connector 26. Connector 26 makes low resistance contact to the circuit pattern on the flexible circuit board 10. This provides electric communication between connector 26 and circuit elements 18a and 18b, which respectively contact terminals on the magnet field sensor chips through contact bumps 14a and 14b.

It should also be mentioned that body 22 is preferably a permanent magnet in this example of the invention. This is preferred for sensing applications in which the item being sensed is not magnetized, or does not contain a magnet. However, if the item being sensed does contain a magnet or is itself magnetized, body 22 does not have to be a permanent magnet. Instead, it could be formed of an unmagnetized high magnetic permeability material, as for example pure iron or steel. In most applications, it would be highly desirable, and even necessary, to include body 22 in the package. However, it is to be understood that body 22 may not be necessary in this embodiment or in embodiments hereinafter described. For example, the plastic encapsulation 24 could be made quite thin under chip 12, and the assembly placed on an iron-based alloy support that has a portion disposed in close proximity to chip 12. In FIGS. 2 and 3, there could be a recess in the bottom of the encapsulation 24. A mating finger on a support could be disposed in the recess. If the recess is specially positioned and/or configured, the mating finger could serve to fix the assembly in predetermined position, as well as provide the high magnetic permeability function. In the FIG. 8 embodiment, the motor case could function as body 22.

As can be seen in FIG. 2, this embodiment of the invention allows the back side or base of the circuit board to provide a thin, protective coating for the magnetoresistor. This provides an extremely thin "effective air gap" between an exciter wheel (not shown in the figure) and the magnetoresistor chip 12.

In addition, it should be recognized that the circuit pattern on a flexible circuit board is normally photolithographically delineated. Accordingly, the pattern can be made with extremely fine detail and with very accurate positioning of contact points 18a' and 18b' for the magnetic field sensor chip 12. This is used to accurately position the chip on the circuit board. Not only can these contact points be very precisely located on the flexible circuit board, but the location can be very readily identified in the resultant product. It can be identified visually because the polyimide film is relatively thin and translucent. Even if the chip cannot be seen through the thickness of the circuit board 10, means can be provided in the circuit board, as for example holes lined with the magnetoresistor 12, or notches or other identification on the edges of the circuit board, to identify the precise location of chip 12 in the finished prepackaged unit shown in FIG. 2. In addition, if desired, location of chip 12 can be preprinted on the back side of flexible circuit board 10. The back side of flexible circuit board 10 is the upper side of flexible circuit board 10 shown in FIGS. 1 and 2.

FIGS. 1 and 2 illustrate a prepackaged unit made in accordance with our invention that incorporates a "flip chip" magnetic field sensor chip. By "flip chip" we mean a chip having contact areas on its face for engagement with contact bumps or contact areas on the circuit board or it has contact bumps on its face for engagement with contact areas on the circuit board. This represents one typical technique for bonding semiconductor chips to a circuit board. It precisely positions the chip in the pattern when the contacts are soldered. Another common technique for interconnecting a semiconductor chip to a circuit is shown in FIG. 3. FIG. 3 illustrates how our invention can be used in connection with a "wire bonded" semiconductor chip. By "wire bonded" we mean a semiconductor chip that is interconnected into a circuit by means of filamentary wires with one end of each wire being bonded to the semiconductor chip and the opposite end of that wire being bonded to a portion of the circuit pattern on the circuit board. Precise positioning of a wire bonded chip in the pattern can be obtained by providing a bonding pad in the pattern and soldering the chip to the pad before wire bonding.

In the FIG. 3 example of this invention, flexible circuit board 10' wraps around the upper surface of a permanent magnet 22 with the circuit pattern facing away from the permanent magnet 22. Accordingly, it is on the upper surface 28 of flexible circuit board 10'. In this embodiment of the invention, the magnetic field sensor chip is a magnetoresistor chip 12' having contacts at its opposite ends. Filamentary wires interconnect the contacts on the magnetoresistor chip 12' with the circuit pattern of flexible circuit 10'. Opposite ends of filamentary wires 30 are respectively ultrasonically bonded or thermocompression bonded to contact pads on the chip and to contact areas in the copper circuit pattern on flexible substrate 10'.

As with the embodiment shown in FIG. 2, the circuit board 10 and chip 12 are encapsulated in a plastic potting 24. However, in this embodiment of the invention, plastic potting 24 extends up over the top surface 28 of a flexible circuit board. It covers both the filamentary bonding wires 30 and the magnetoresistor chip 12'. This additional potting on the top surface increases the "effective air gap" of the resultant prepackaged unit. However, it is a practical necessity since the filamentary wires 30 have to be protected. For manufacturers who choose to use wire bonding and where most sensitive magnetic response is not required, this may be a practical alternative to the embodiment shown in FIG. 2.

Chips 12 and 12' in FIGS. 2 and 3 are in very predetermined locations on the flexible circuit boards 10 and 10'. If desired, reference locations on the circuit pattern, or on the polyimide substrate of the circuit boards 10 and 10', can be used for alignment in molding automatically and/or transferred to the plastic encapsulation 24 during molding or potting. In such instance, the encapsulation 24 can even have a distinctive configuration that nests in a complementary holder. When so nested, the sensor chip 12 or 12' can automatically be put in very precise alignment with an exciter member. This ease of alignment forms a part of this invention. Precision alignment is also involved in FIG. 4.

FIG. 4 illustrates another practical application of this invention. It is recognized that there are a number of applications where a plurality of magnetic field sensing functions are desired. For example, one may desire to separately sense different positions of a rotating disk while also counting the revolutions of the disk. One may also want to closely position two magnetic field sensors. One may even want to electrically couple their outputs. In this invention, a single flexible circuit board can be used to support a plurality of magnetic field sensor chips in very precisely predetermined locations on the circuit board. In addition, the chips will inherently be in very precisely located predetermined disposition with respect to each other. In addition, they can be placed in extremely close proximity to one another, with the proximity being predetermined and of known location with respect to reference locations in the printed circuit pattern and/or locations on the supportive substrate of the board. The locations can be edge locations or internal locations, as, for example, mounting holes for the circuit board. The predetermined relative location of the chips with respect to each other, and the predetermined location of the chip group with respect to a reference location on the circuit board, can be readily used. The predetermined locations can cooperate with predetermined exciter traces on a rotating shaft or three closely spaced disks on a rotating shaft. One can provide a complementary-shaped support for our prepackaged sensing unit in predetermined location with respect to the rotating disks. Mounting of the prepackaged unit thus automatically aligns the magnetic field sensor chips with the disks. All that is necessary is to provide mounting reference locations on the support that mate with cooperating reference conformations on the flexible circuit board. Even if such automatic alignment is not used, it is to be recognized that since the chips are in fixed disposition with respect to one another, manual alignment of all of the chips with the exciter disks is simplified.

Figure 5:
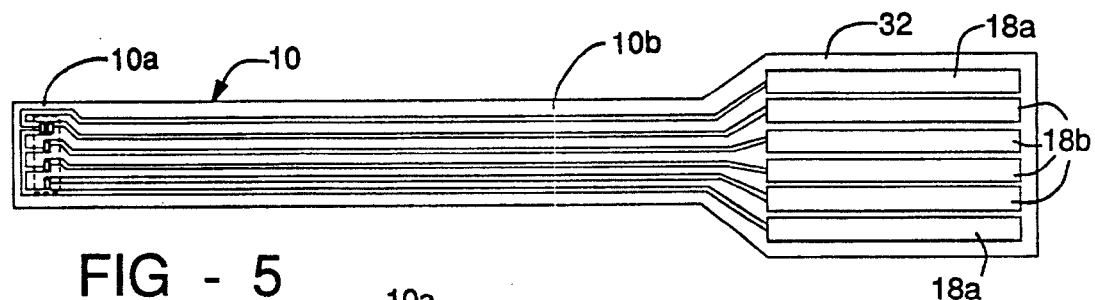
FIG. 5 shows the entirety of the flexible circuit board shown in FIG. 4.

FIG. 4 shows an enlarged fragmentary view of the left end of an elongated flexible circuit board 10 which is shown in FIG. 5. Circuit board 10 has a circuit pattern 18 thereon that includes circuit traces 18a and 18b. The circuit traces 18a and 18b are respectively connected to magnetoresistor chips 12a, 12b, 12c, 12d and 12e. It can be seen that each of the magnetoresistor chips 12a through 12e have their opposite ends respectively connected to circuit traces 18a and 18b. An especially close spacing of magnetoresistor chips 12d and 12e is illustrated in FIG. 4 to point out that this invention permits extremely close spacing of two magnetoresistor chips in the same exciter track to provide additional or complementary functions, as, for example, special encoding, coupling of magnetoresistor outputs, and the like. In this embodiment of the invention, all of magnetoresistor chips 12a through 12e are disposed on circuit board 10 over a single magnetic body 22, such as a permanent magnet or iron-based alloy. With close spacing of the magnetoresistor chips 12a through 12e, use of a single magnetic body 22 will probably be preferred. On the other hand, if desired, each separate chip 12a through 12e could be disposed over its own separate magnetic body, or selected groups could each be disposed over a separate body, as for example magnetoresistors 12d and 12e.

FIG. 5 shows the entire circuit board 10, whose left end is shown in fragmentary enlargement in FIG. 4. No reference numerals are shown at the left of FIG. 5 to avoid obscuring what is shown. The reference numerals at the left end of FIG.

5 would be as shown in FIG. 4. FIG. 5 shows the circuit board traces 18a and 18b extended from the magnetoresistors 12a through 12e to an enlarged area 32 at the right of FIG. 5. At enlarged area 32, the circuit board traces 18a and 18b are enlarged to facilitate connection to a connector (not shown). Any of the usual types of flexible circuit board connectors can be used, as indicated at 26 in FIGS. 2 and 3.

As indicated above, a magnet or material of high permeability material such as iron or steel would be placed beneath the left end of the flexible circuit board 10 in the area that contains magnetoresistor chips 12a, 12b, 12c, 12d and 12e. A magnet or a high permeability material is generically referred to herein as a magnetic field means. It is referred to as a magnetic field means because it is a means for providing a high concentration of magnetic flux in the area of the magnetic field sensor chip. If the magnetic field means is a magnet, it is the source of the magnetic flux. If the magnetic field means is a high permeability material, it will concentrate flux lines in the area of the magnetic field sensor chips. Hence, close presence of the high permeability material to the magnetic field sensor chips 12a through 12e will cause them to be subjected to a higher magnetic field strength. It should also be mentioned that the magnetic field means can be a single magnet or body of iron large enough to cover the area of all of the magnetic field sensor chips 12a through 12e. On the other hand, a discreet magnet or piece of iron can be disposed under each of the magnetic field sensor chips 12a through 12e. This invention contemplates using a single magnet or multiplicity of magnets for a multiplicity of magnetic field sensor chips.

It should also be mentioned that the circuit traces 18a and 18b are covered with a polyimide film 20 as they are in FIG. 1. Also, the fill 20 has an opening 20a in the area where chips are attached to the circuit traces. Accordingly, environmental protection is provided on the circuit traces outside the area of the magnetic field sensor chips. If desired, a polyimide patch could be used to cover window 20a. However, this would increase "effective air gap" and therefore would not be used unless really needed.

Figure 6:
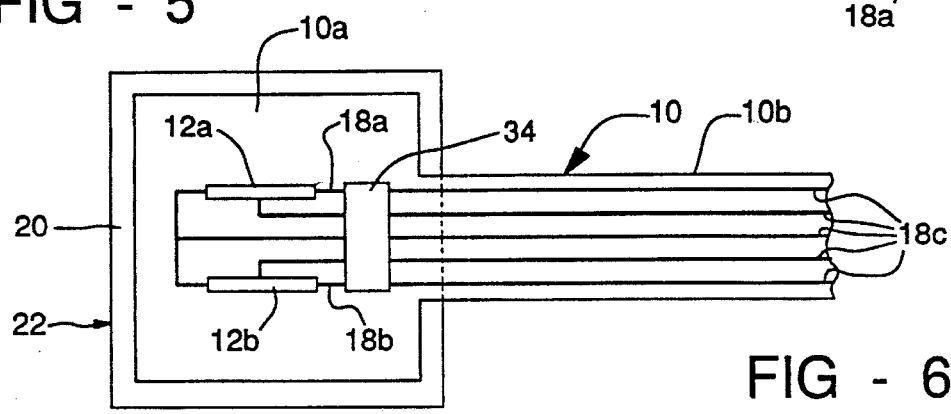
FIG. 6 shows a plan view of a flexible circuit board having two magnetoresistor chips disposed over a magnet, with the flexible circuit board also containing an integrated circuit chip for conditioning the output signal of the magnetoresistor chips.

Reference is now made to FIG. 6 which shows still another embodiment of the invention. In this embodiment of the invention, the flexible circuit board portion 10a, where the magnetoresistor chips 12a and 12b are mounted, is larger than the pigtail portion 10b which contains the circuit traces 18c. The right end of the pigtail portion 10b can lead to a connector, such as connector 26 in FIGS. 2 and 3, or to another portion (not shown) of the flexible circuit board 10 that contains further circuitry.

The prepackaged magnetic field sensor unit shown in FIG. 6 has another distinctive feature. An additional integrated circuit chip 34 is also disposed on the flexible circuit board portion 10a, along with the magnetic field sensor chips 12a and 12b and their interconnecting circuit board traces 18a and 18b. The magnetic field sensor chips 12a and 12b can be magnetoresistor chips, Hall effect devices or MAGFETs, as previously indicated for other embodiments of this invention. The integrated circuit chip can be a signal conditioning chip that, for example, contains circuitry that compensates for small changes in output from the magnetic field sensor chips 12a and 12b due to temperature variation. In addition, or alternatively, integrated circuit chip 34 can provide a digital output or other type of output based on an analog input received from the magnetic field sensor chips 12a and 12b. In any event, the circuit pattern on portion 10a of the flexible circuit board 10 can be readily designed to accommodate such chip. The increased area needed to accommodate this chip may not be significant in many applications. Disposing integrated circuit chip 34 directly over a permanent magnet or over an iron plate is not particularly detrimental for many applications. If it is, the integrated circuit chip 34 could be redesigned so as to nullify or minimize any undesirable magnetic field effects or offset from the magnet 22.

The circuit board traces 18c on the pigtail portion 10b of the flexible circuit board might also include traces for direct connection with the magnetic field sensor units 12a and 12b, if desired. It should also be mentioned that the flexible circuit board portion 10a is preferably bonded to the surface of magnet 22 by as thin a layer of adhesive as is possible, unless the adhesive has a high magnetic permeability. In some cases it may be possible to simply heat bond the polyimide plastic backside of the flexible circuit board portion 10a to the facing surface of magnet 22. In such instance, there is no additional interfacial layer of low magnetic permeability interposed between the magnetic field sensor chips 12a and the magnet 22.

Up to this point in this description, no special mention is made with respect to the contour of the flexible circuit board and/or the surfaces to which the flexible circuit board is bonded. Such a surface can be the magnetic field means or some other support. The magnetic field means, as mentioned, can be a permanent magnet and/or a body or layer of high permeability material. U.S. Pat. No. 4,926,122, issued May 15, 1990 to some of the inventors named herein, discloses a distinct advantage in providing a high permeability layer on the surface of a magnet body that is larger than the magnetic field sensor chip. Accordingly, the magnet 22 in FIG. 6 could have a high permeability layer, as for example an iron-containing layer, on its surface that contacts the magnetic field sensor chip 12.

No particular mention has been made in the foregoing discussion as to the surface contour of the magnet beneath the circuit board area containing the magnetoresistor chips. In the preceding Figures of the drawings, the surface of the magnet is shown to be flat. It should be mentioned that in some applications, it may be more desirable that the surface of the magnet not be flat; for example, the surface of the magnet shown in FIG. 4 could actually have a surface contour that is along the lines of the magnet contour shown in FIG. 7. The sensor shown in FIG. 7 could be either single or multiple track.

Figure 7:
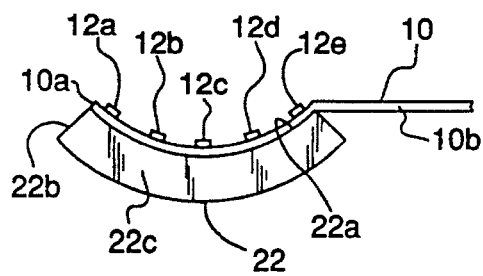
FIG. 7 shows a cross-sectional view on a further variation of the embodiment shown in FIG. 6 in which the permanent magnet provides a predetermined arcuate configuration to the portion of the flexible circuit board containing the magnetoresistor elements.

FIG. 7 shows an embodiment of the invention analogous to the embodiment shown in FIG. 6. However, in this embodiment of the invention, a signal conditioning integrated circuit chip 34 is not included in the predetermined location area of the magnetic field sensor chips. In addition, five magnetoresistor chips are shown instead of two. However, most importantly, this embodiment of the invention shows magnet 22 as having an arcuate shape. More specifically, magnet 22 is a frusto-cylindrical body that has a frusto-cylindrical surface 22a bonded to the back side of portion 10a of a flexible circuit board 10. As with portion 10a in FIG. 6, the edges of portion 10a in FIG. 7 are oriented in a predetermined manner on surface 22a of the magnet. They are registered with some of the magnet edges. A circuit pattern has a predetermined disposition as to the edges of the circuit board portion 10a it is formed on. In addition, the precise locations of the magnetoresistor chips 12a, 12b, 12c, 12d and 12e are in predetermined locations with respect to the circuit pattern. Accordingly, positioning of the edges of flexible circuit board portion 10a into a predetermined location on the surface 22a of magnet 22 positions the magnetoresistor chips 12a through 12e in predetermined location on the magnet surface. They are also in predetermined location with respect to edges of the magnet 22. In such instance, positioning of the magnet 22 positions all of the magnetoresistor chips 12a through 12e.

For simplicity, FIG. 7 shows the left edge of circuit board portion 10a aligned with the left edge 22b of permanent magnet 22. The left edge 22b of permanent magnet 22 is considered to be a radial edge of the frustocylindrical form. If the edge of the circuit board portion facing the viewer in FIG. 7 is also aligned with the axial edge 22c of magnet 22, an even more precise alignment of circuit board 10a on magnet 22 can be obtained. Analogously, if the opposite side edge of the flexible circuit board portion 10a is aligned with the opposite axial face (not shown) of the frusto-cylindrical magnet 22, still further precision in orienting the flexible circuit board on the face 22a of magnet 22 can be obtained. In such instance, locating magnet 22 in a predetermined holder can automatically position magnetoresistor elements 12a through 12e with respect to very closely spaced but separate exciter tracks on a rotating element. In this connection, it should be mentioned that magnetoresistor elements 12a, 12b, 12c, 12d and 12e are axially spaced on circuit portion 10a analogous to spacing of magnetoresistor chips 12a and 12b in FIG. 6.

On the other hand, some or all of the magnetoresistor chips 12a through 12e could be axially in the same rotation plane but radially spaced in that plane. In such instance, they would be spaced analogous to the spacing of magnetoresistor chips 12d and 12e of FIG. 4. The particular radial and/or axial spacing that is desired would, of course, be dependent upon the particular application which a user of this prepackaged element might have in mind. While not shown, it is also contemplated that a layer of polyimide film could be disposed over the magnetoresistor chips for environmental protection. On the other hand, a polyimide film is a low permeability material. As previously mentioned, interposing a layer of low permeability material between an exciter and a magnetic field sensor chip increases the "effective air gap" between the chip and the exciter.

Accordingly, FIG. 7 illustrates that the preselected circuit board part 10a that contains the magnetic field sensor chips need not be planar and need not be potted in plastic for use. Still further, FIG. 7 illustrates that the edges of the prepackaged unit can be used for precise location of the magnetic field sensor chips. This is because the chips are located very precisely in the prepackaged unit with respect to selected reference locations on the prepackaged unit. Such reference locations can be edges but they do not have to be. They could be holes or notches. Ordinarily, this might be an edge location on the unit as, for example, one or both of edges 22b or 22c on the permanent magnet 22 shown in FIG. 7. On the other hand, if it is desired to pot the circuit board part 10a and its associated magnet 22 in plastic, edges 22b and/or 22c can be used to locate the magnet within the encapsulation mold, effective to produce predetermined reference locations on the periphery of the encapsulation (not shown in FIG. 7). Accordingly, the encapsulated prepackaged unit will also have reference locations that can be placed against abutments or the like, effective to very precisely position the magnetic field sensor chips with respect to precisely located exciters.

Figure 9:
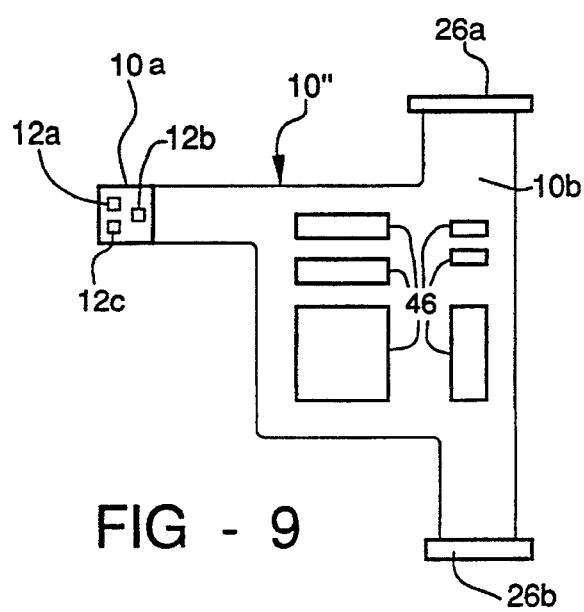
FIG. 9 shows a flexible circuit board that includes a portion for magnetic field sensing and a portion for other purposes, which board could be used for motor control within the housing of an electric motor.

While not shown in FIG. 7, the portion 10b of the flexible circuit board shown in the right of the Figure would lead to a terminal connector, such as illustrated in FIGS. 2-3. On the other hand, a circuit board portion 10b in FIG. 7 could extend to other portions of a flexible circuit board, as illustrated in FIG. 9.

Figure 8:
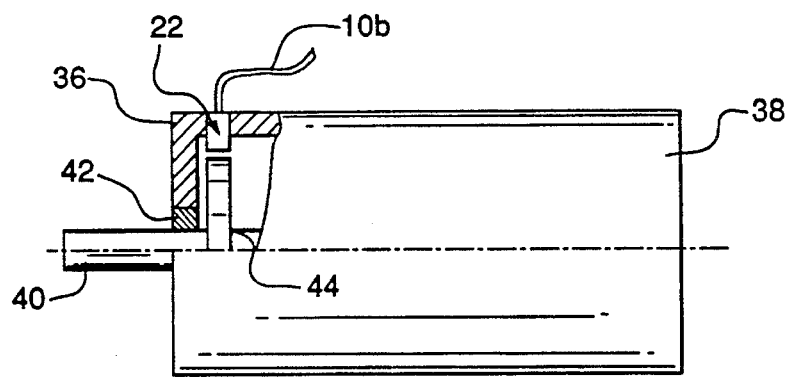
FIG. 8 shows an elevational view, with part broken away, of an electric motor containing a prepackaged magnetic field sensing unit such as shown in FIG. 7, in combination with a multiple track exciter affixed to the motor shaft.

The flexible circuit board portion 10b leads to a connector that would form a prepackaged unit such as diagrammatically illustrated in FIG. 8. Accordingly, the FIG. 7 prepackaged unit appears as the magnet 22 and pigtail 10b in FIG. 8. FIG. 8 shows magnet 22 as disposed in predetermined position in the housing 36 of a brushless electric motor 38. The housing 36 can be seen in the portion of FIG. 8 broken away at the upper left of the Figure. Rotary components of the motor are supported on shaft 40, which is rotationally supported on housing 36 by means of bearings 42 (only one of which can be seen in the part broken away in the drawing).

Magnet 22 is disposed in a predetermined location in housing 36 so that magnet 22 is radially aligned with a multiple track exciter 44. One may like to refer to the exciter 44 as a shaft encoder. In one embodiment of the invention, the multiple track exciter 44, or shaft encoder, can be a plurality of circular steel disks having teeth, slots or other encoding conformations on their periphery. The disks have a-thickness on the order of the dimension of the magnetic field sensor chip in the axial direction of the disk. Also, the disks should most preferentially be spaced the same distance apart as the chips are spaced apart on the flexible circuit board portion 10a.

The multiple track exciter 44 is coaxially mounted on the rotor shaft of the electric motor and is in direct radial alignment with the magnetic field sensor chips supported by magnet 22. This is analogous to the alignment of a brush holder with a commutator of an electric motor of the brush type.

As previously mentioned, magnet 22 could alternatively be a body of high magnetic permeability material 22. In such instance, exciter 44 would be of permanent magnet material, or at least support it. Exciter 44 could be a circular disk having a magnet affixed to a particular circumferential location. Exciter 44 could also be a disk having a plurality of magnets affixed at select circumferential locations. Still further, exciter 44 could be a plurality of coaxial disks, each of which have one or more magnets on their periphery. It might be convenient to make exciter 44 be a relatively thick permanent magnet disk having selected locations that are demagnetized. The selected locations could be in a multiplicity of tracks spaced to correspond to the spacing of the multiplicity of magnet field sensor chips supported on body 22.

Still further, it should be recognized that a permanent magnet motor can have the rotor be a permanent magnet. In such event, the rotor itself can have selected surface areas demagnetized in the form of tracks to form one or more tracks. The demagnetization could be selectively done by means of a laser or an electron beam to relatively heat surface portions of the permanent magnet above a Curie temperature. It would not be difficult to precisely locate the demagnetization areas on the rotor. The rotor would be held in predetermined position within housing 36 by means of appropriate thrust bearings 42. In such instance, the tracks on the rotor could be made to automatically align with chips on magnetic field means 22 when the rotor is installed in the motor housing 36.

It should be mentioned that in FIG. 8 the prepackaged magnetic field sensor unit would be connected to external electronics by means of connector 26. As suggested in the discussion concerning FIG. 6, and as more explicitly shown in connection with FIG. 9, the flexible circuit board that contains the magnetic field sensor chips can also contain other electrical components. In FIG. 6, we described that one other electrical component can be a signal conditioning integrated circuit chip. Incorporation of such a chip with the sensor chip makes the magnetic field sensor unit become a "smart sensor".

The "pigtail" circuit board portion 10b of the sensors described thus far can be expanded to provide a substrate upon which many other interface circuit chips can be disposed. Among them could be motor control circuitry. More specifically, FIG. 9 shows a flexible circuit board 10" that has a circuit pattern on it (not shown) that interconnects magnetic field sensor chips 12a, 12b and 12c fixed to circuit board portion 10a in predetermined locations. The magnetic field sensor chips 12a through 12c interconnect via the printed circuit pattern (not shown) with a plurality of integrated circuit chips 46 that are disposed on the enlarged "pigtail" portion 10b of the flexible printed circuit board 10". A permanent magnet that is rectangular in plan view registers with the sides of portion 10a of the flexible circuit board, effective to provide a predetermined reference location for the magnetic field sensor chips 12a through 12c on flexible circuit board portion 10a. This is analogous to disposition of magnet 22 to flexible circuit board portion 10a in FIG. 7. In such instance, the flexible circuit board 10" might even wholly be enclosed within the motor housing 36 of the brushless motor 38 shown in FIG. 8. Since the circuit board is flexible, it can be wrapped around the rotor within the motor housing in a non-critical area. In such instance, one of the connectors, for example, connector 26a, would be connected within the motor. A second connector, such as connector 26b, would extend out of the motor housing to be available for connection to a source of power and perhaps other control circuitry. For ease of illustration, and for better focus on the variation of the invention provided in FIG. 9, traces of the circuit pattern are not shown on the flexible circuit board 10" in FIG. 9.

The detailed description shows that the preferred embodiments of the present invention are well suited to fulfill the objects above stated and recognize that those skilled in the art may make various modifications or additions to the preferred embodiments chosen to illustrate the present invention, without departing from the spirit and proper scope of the invention. For example, other magnet configurations or apparatus sensor combinations are clearly possible. Accordingly, it should be understood that the protection sought and to be afforded hereby should be deemed to extend to the subject matter defined by the appended claims, including all fair equivalents thereof.

The embodiments of the invention in which an exclusive property or privilege is claimed are defined as follows:

1. A magnetic field sensor assembly comprising:

a flexible circuit board having a first major surface with a predetermined area for receiving at least one semiconductor magnetic field sensor chip, and also having an opposite major surface and a given thickness;

at least one semiconductor magnetic field sensor chip affixed to said predetermined area of said first major surface of said flexible circuit board;

a magnetic field means disposed against said magnetic field sensor chip;

an electrically nonconductive supporting body enclosing said semiconductor magnetic field sensor chip and said magnetic field means on said predetermined area of said first major surface of said flexible circuit board but leaving said opposite major surface exposed opposite said predetermined area, whereby said body supports said flexible circuit board but leaves said semiconductor magnetic said sensor chip covered in said predetermined area by only said thickness of said flexible circuit board;

locating means on said flexible circuit board for precisely positioning said circuit board on said body, said locating means being in predetermined identified dispositional relationship with respect to said at least one affixed semiconductor magnetic field sensor chip, whereby precise positioning of said circuit board on said body by said locating means concurrently precisely positions said at least one affixed semiconductor magnetic field sensor chip on said body;

an extension of said flexible circuit board from said predetermined area to a second area outside of said body;

a circuit pattern on said first major surface, including portions of said predetermined area proximate said semiconductor magnetic field sensor chip for interconnection therewith;

means for interconnecting said semiconductor magnetic field sensor chip with said circuit pattern portions;

electrical conductors in said circuit pattern leading away from said chip-proximate portions to said second area of said flexible circuit board outside of said body; and means connected to said electrical conductors in said second area for receiving an output signal from said semiconductor magnetic field sensor;

effective to provide a semiconductor magnetic field sensing chip on a flexible circuit board in precisely known disposition with respect to a supporting body, and to permit a reduced effective air gap between said chip and an exciter by providing a reduced packaging thickness covering said chip.

2. The magnetic field sensor assembly as defined in claim 1 wherein the magnetic field means is a permanent magnet.

3. The magnetic field sensor assembly as defined in claim 1 wherein the electrically nonconductive supporting body is plastic.

4. The magnetic field sensor assembly as defined in claim 3 wherein the magnetic field means is a permanent magnet.

* * * * *